(12) United States Patent
Bussing et al.

(10) Patent No.: US 11,567,890 B2
(45) Date of Patent: Jan. 31, 2023

(54) DETERMINING AN ACTION BY AN ELECTRONIC DEVICE BASED ON VOLTAGE AT A PORT OF THE ELECTRONIC DEVICE

(71) Applicant: Allegro MicroSystems, LLC, Manchester, NH (US)

(72) Inventors: Wade Bussing, Manchester, NH (US); Maxwell McNally, Manchester, NH (US)

(73) Assignee: Allegro MicroSystems, LLC, Manchester, NH (US)

( * ) Notice: Subject to any disclaimer, the term of this patent is extended or adjusted under 35 U.S.C. 154(b) by 49 days.

(21) Appl. No.: 16/452,804

(22) Filed: Jun. 26, 2019

(65) Prior Publication Data

US 2020/0409886 A1    Dec. 31, 2020

(51) Int. Cl.
*G06F 13/40* (2006.01)
*H03K 17/687* (2006.01)

(52) U.S. Cl.
CPC ....... *G06F 13/4022* (2013.01); *H03K 17/687* (2013.01)

(58) Field of Classification Search
CPC ................... G06F 13/4022; H03K 17/687
See application file for complete search history.

(56) References Cited

U.S. PATENT DOCUMENTS

| | | | |
|---|---|---|---|
| 6,356,132 B1* | 3/2002 | Mastrocola | H03K 5/131 327/269 |
| 7,398,345 B2* | 7/2008 | Larson | G06F 13/4291 710/100 |
| 7,552,016 B2 | 6/2009 | Vig et al. | |
| 7,962,662 B2* | 6/2011 | Richards | G06F 13/4072 710/9 |
| 8,054,071 B2 | 11/2011 | Doogue et al. | |
| 8,122,159 B2 | 2/2012 | Monreal | |
| 8,773,123 B2 | 7/2014 | Doogue et al. | |
| 9,391,618 B2* | 7/2016 | Benzer | H03K 19/007 |
| 9,552,315 B2 | 1/2017 | Monreal | |
| 9,621,140 B1 | 4/2017 | Fernandez et al. | |
| 2017/0115711 A1* | 4/2017 | Jaramillo | H04L 12/10 |
| 2018/0152183 A1* | 5/2018 | Vemula | G06F 13/4282 |
| 2019/0391185 A1 | 12/2019 | El Bacha et al. | |

FOREIGN PATENT DOCUMENTS

DE    11 2009 004 394 B4    12/2015

* cited by examiner

*Primary Examiner* — Ryan Johnson
*Assistant Examiner* — Colleen J O Toole
(74) *Attorney, Agent, or Firm* — Daly, Crowley, Mofford & Durkee, LLP

(57) ABSTRACT

In one aspect, an electronic device includes a switching circuit connected to a resistance circuit and ground, the resistance circuit connected to a port and the port configured to be connected in series to an external resistor and a supply voltage. A voltage at the port is a first voltage that is less than the supply voltage if the switching circuit is enabled to be a closed circuit and the voltage at the port is a second voltage that is equal to the supply voltage if the switching circuit is enabled to be an open circuit.

40 Claims, 3 Drawing Sheets

DETERMINING AN ACTION BY AN ELECTRONIC DEVICE BASED ON VOLTAGE AT A PORT OF THE ELECTRONIC DEVICE

BACKGROUND

Traditionally electronic devices are manufactured in large quantities whenever possible in order to reduce costs. These identical electronic devices are integrated into electronic circuitry as opposed to having more costly individualized (e.g., specialized) parts integrated into the electronic circuitry. For example, a number of identical electronic devices may be integrated into electronic circuitry having a microcontroller. In order for the microcontroller to differentiate one identical electronic device from another identical electronic device in the electronic circuitry, each identical electronic device is separately addressed.

SUMMARY

In one aspect, an electronic device includes a switching circuit connected to a resistance circuit and ground, the resistance circuit connected to a port and the port configured to be connected in series to an external resistor and a supply voltage. A voltage at the port is a first voltage that is less than the supply voltage if the switching circuit is enabled to be a closed circuit and the voltage at the port is a second voltage that is equal to the supply voltage if the switching circuit is enabled to be an open circuit.

In another aspect, electronic circuitry includes the electronic device. The electronic device includes a switching circuit connected to a resistance circuit and ground, the resistance circuit connected to a port and the port. The electronic circuitry also includes a supply voltage and a resistor connected in series with the port and the supply voltage. A voltage at the port is a first voltage that is less than the supply voltage if the switching circuit is enabled to be a closed circuit and the voltage at the port is a second voltage that is equal to the supply voltage if the switching circuit is enabled to be an open circuit.

In a further aspect, a method includes providing a first voltage at a port of the electronic device comprising a switching circuit that is less than a supply voltage if the switching circuit is enabled to be a closed circuit. The switching circuit is connected to ground and to a resistance circuit, and the resistance circuit is connected to the port. The method further includes determining an action by the electronic device in response to the first voltage, performing the action and providing a second voltage at the port of the electronic device that is equal to a supply voltage if the switching circuit is enabled to be an open circuit.

In a still further aspect, an electronic device includes a switching means connected to a resistance means and ground, the resistance means connected to a port and the port configured to be connected in series to an external resistor and a supply voltage. A voltage at the port is a first voltage that is less than the supply voltage if the switching means is enabled to be a closed circuit. The first voltage is associated with an action performed by the electronic device and the second voltage at the port is a second voltage that is equal to the supply voltage if the switching means is enabled to be an open circuit.

DESCRIPTION OF THE DRAWINGS

The foregoing features may be more fully understood from the following description of the drawings. The drawings aid in explaining and understanding the disclosed technology. Since it is often impractical or impossible to illustrate and describe every possible embodiment, the provided figures depict one or more illustrative embodiments. Accordingly, the figures are not intended to limit the scope of the broad concepts, systems and techniques described herein. Like numbers in the figures denote like elements.

DETAIL DESCRIPTION

Described herein are techniques to provide a first voltage to a port (e.g., pin) of an electronic device, determining an action by the electronic device in response to the first voltage and providing a second voltage at the port of the electronic device. In one example, the first voltage may be provided during or after startup of the electronic device. In one particular example, the first voltage may be used by the electronic device to determine an address of the electronic device.

The techniques described herein allow the port of the electronic device to be used for multiple purposes. For example, the port of the electronic device may be used for setting the address of the electronic device (e.g., using the 12C protocol) for a first moment in time and used as a data port to provide data (e.g., to another electronic device (e.g., a microcontroller)) for a second moment in time.

While this description focuses on setting the address of an electronic device for example purposes, other actions may be performed by the electronic device. Other actions may include but are not limited to setting a bandwidth of a filter, setting a sensitivity of an analog or digital signal path, setting a threshold for a fault comparator, enabling test modes for debugging and so forth.

Figure 1:
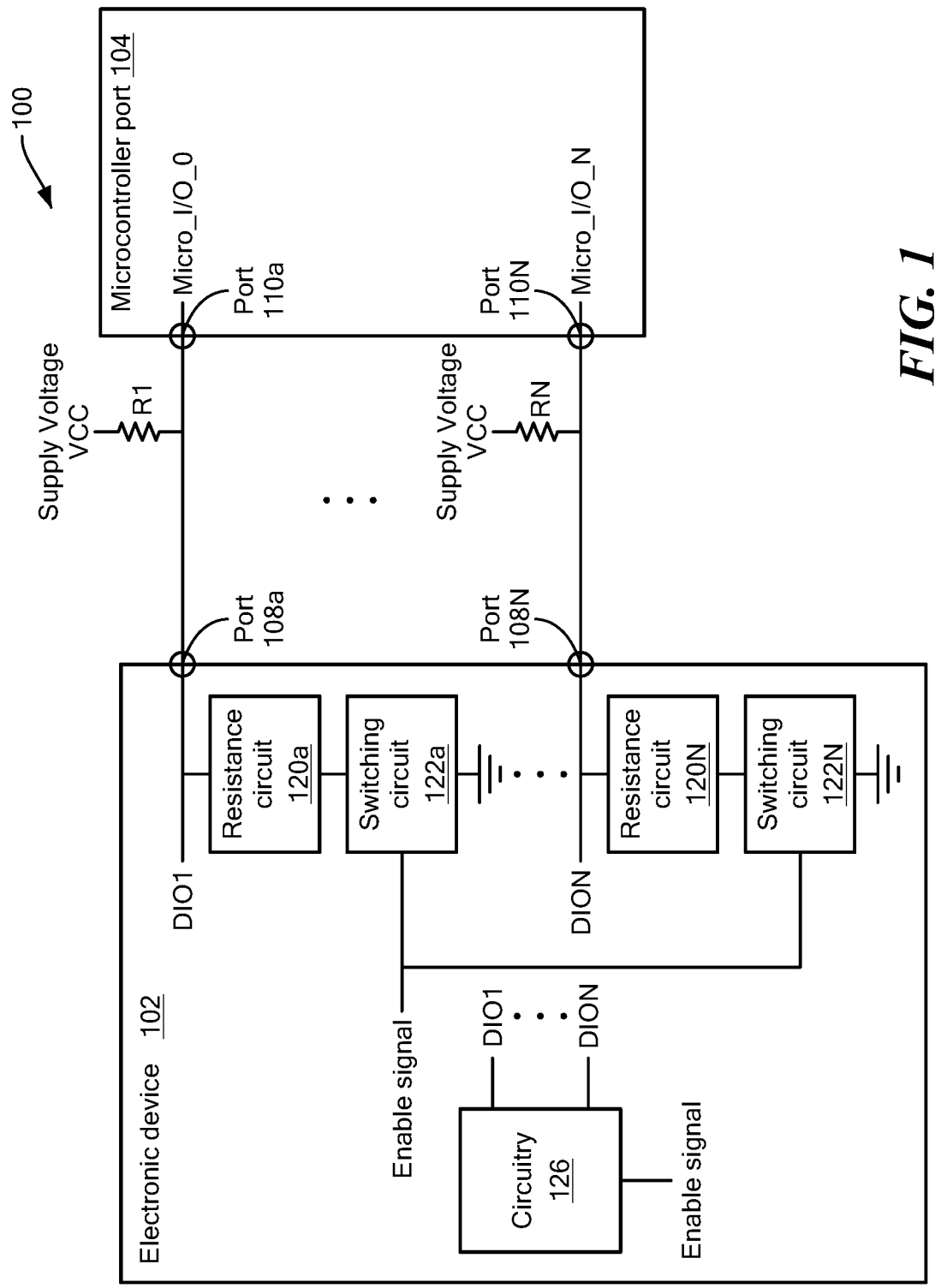
FIG. 1 is a circuit diagram of an example of electronic circuitry having an electronic device.

Referring to FIG. 1, electronic circuitry 100 includes an electronic device 102 having ports (e.g., a port 108*a*, . . . , and a port 108N) and a microcontroller 104 having ports (e.g., a port 110*a*, . . . , and a port 110N). The electronic circuitry 100 also includes resistors (e.g., a resistor R1, . . . , and a resistor RN) and each resistor R1-RN is connected in series with a supply voltage VCC. Each resistor R1-RN is also connected to a corresponding one of the ports 108*a*-108N of the electronic device 102 and is connected to a corresponding one of the ports 110*a*-110N of the microcontroller 104. For example, the resistor R1 is connected to the port 108*a* and to the port 110*a*. In another example, the resistor RN is connected to the port 108N and to the port 110N.

In some examples, the resistors R1-RN may each include one or more resistors. In some examples, the one or more of the resistors R1-RN may have a different measured resistance. In some examples, the one or more of the resistors R1-RN may have the same measured resistance.

Each of the ports 108*a*-108N have a corresponding voltage signal (e.g., a voltage signal DIO1, . . . , a voltage signal DION). For example, the port 108*a* has a voltage signal DIO1. In another example, the port 108N has the voltage signal DION.

The electronic device 102 includes resistance circuits (a resistance circuit 120*a*, . . . , a resistance circuit 120N) connected to switching circuits (e.g., a switching circuit 122*a*, . . . , a switching circuit 122N) and to the ports 108a-108N. For example, the resistance circuit 120a is connected in series with the switching circuit 122a and to the port 108a. In another example, the resistance circuit 120N is connected in series with the switching circuit 122N and to the port 108N. Each of the switching circuits 122a-122N is connected to ground.

In some examples, one or more of the resistance circuits 120a-120N may include one or more resistors. In some examples, one or more of the resistance circuits 120a-120N may be the same resistance circuit. In some examples, one or more of the resistance circuits 120a-120N may have a different measured resistance. In some examples, the one or more of the resistance circuits 120a-120N may have the same measured resistance.

In some examples, one or more of the switching circuits 122a-122N may include one or more switches. In some examples, one or more of the switching circuits 122a-122N may be the same switching circuit. In some examples, one or more of the switching circuits 122a-122N may include at least one transistor. In some examples, the at least one transistor is at least one n-channel metal oxide semiconductor field-effect transistor (MOSFET).

The electronic device 102 may also include circuitry 126. In one example, the circuitry 126 provides an enable signal. The circuitry 126 may include timers or other logic circuits to determine when and/or if to provide the enable signal. In one example, the enable signal is provided by the circuitry 126 at startup (e.g., when the electronic device 102 is turned on). In some examples the enable signal is provided by the circuitry 126 periodically. In some examples, the enable signal is provided by the circuitry 126 after detection of a change in the electrical circuitry 100 such as added electronic devices and/or a fault in the electronic circuitry 100 such as, for example, a fault in the electronic device 102.

In some examples the circuitry 126 may include one or more of a filter, an analog or digital signal path or a fault comparator.

In some examples, the circuitry 126 measures the voltage signals DIO1-DION from the ports 108a-108N. In some examples, the circuitry 126 provides the voltage signals DIO1-DION to the ports 108a-108N. In one particular example, the circuitry 126 measures the voltage signals DIO1-DION to determine an action (e.g., setting an address of the electronic device) at a first point in time and then, at a second point in time, the circuitry 126 provides the voltage signals DIO1-DION including data such as, for example, sensor data or voltage signals DIO1-DION may include either state-based diagnostic signals (e.g., fault, no fault and so forth) or communication signals.

In one example, if the electronic device 102 uses an open drain output, the electronic device 102 further includes an additional transistor (e.g., an n-channel MOSFET) (not shown) opened to ground that pulls the output low (e.g., for fault or bus communication) at the ports 108a-108N. In a second example, if the electronic device 102 uses a push-pull output at the ports 108a-108N, the electronic device 102 (e.g., using circuitry 126) to force a voltage potential at the ports 108a-108N. As would be understood by one of ordinary skill in the art, both of these examples work with the external resistors R1-RN and the connections to the supply voltage VCC, which are passive and do not need to be switched or changed in an application.

By setting the address of the electronic device, or other device settings, with external hardware (e.g., R1-RN, supply voltage VCC) in situ, the circuitry 100' prevents the need for an individual programming step to differentiate device addresses and removes the possibility of electronic devices being programmed or placed incorrectly.

In one example of the operation of the electronic device 102, the circuitry 126 provides the enable signal to the switching circuits 122a-122N. The enable signal "closes" the switching circuits 122a-122N. In one example, the closing of the switching circuits 122a-122N provides a direct electrical path to ground for each of the resistance circuits 120a-120N. In one example, the circuitry 126 measures the voltage signals DIO1-DION at the ports 108a-108N. Based on the voltage signals DIO1-DION received, the circuitry 126 performs an action. In one example, the circuitry 126 sets an address of the electronic device 102. In other examples, the circuitry 126 may perform one or more of setting a bandwidth of a filter, setting a sensitivity of an analog or digital signal path, setting a threshold for a fault comparator, enabling test modes for debugging and so forth. As would be evident to one of ordinary skill in the art, the selection of resistors R1-RN controls the voltage signals DIO1-DION measure at the ports 108a-108N if the switching circuits 122a-122N are closed.

In some examples, after a period of time, the circuitry 126 changes the enable signal and the enable signal (or, in some examples, a lack of an enable signal) "opens" the switching circuits 122a-122N. In one example, the opening of the switching circuits 122a-122N provides an open circuit to ground for each of the resistance circuits 120a-120N so that the voltage signals DIO1-DION at the ports 108a-108N are brought up to the supply voltage VCC.

In one example, the electronic device 102 may be a sensor. The sensor may be a sensor used in a vehicle such as an unmanned vehicle, a motor vehicle, a naval vessel, an airplane, a space vehicle and so forth. In one particle example, the electronic device 102 may be one or more of a brake sensor, a speed sensor, an angle sensor, a motor rotation sensor, a diagnostic sensor and so forth.

In some examples, the electronic device 102 is an integrated circuit chip. In some examples, the electronic device 102 may be a magnetic field sensor. As used herein, the term "magnetic field sensor" is used to describe a circuit that uses a magnetic field sensing element, generally in combination with other circuits. Magnetic field sensors are used in a variety of applications, including, but not limited to, an angle sensor that senses an angle of a direction of a magnetic field, a current sensor that senses a magnetic field generated by a current carried by a current-carrying conductor, a magnetic switch that senses the proximity of a ferromagnetic object, a rotation detector that senses passing ferromagnetic articles, for example, magnetic domains of a ring magnet or a ferromagnetic target (e.g., gear teeth) where the magnetic field sensor is used in combination with a back-biased or other magnet, and a magnetic field sensor that senses a magnetic field density of a magnetic field.

In some examples, the circuitry 126 includes one or more magnetic field sensing elements. As used herein, the term "magnetic field sensing element" is used to describe a variety of electronic elements that can sense a magnetic field. The magnetic field sensing element can be, but is not limited to, a Hall effect element, a magnetoresistance element, or a magnetotransistor. As is known, there are different types of Hall effect elements, for example, a planar Hall element, a vertical Hall element, and a Circular Vertical Hall (CVH) element. As is also known, there are different types of magnetoresistance elements, for example, a semiconductor magnetoresistance element such as Indium Antimonide (InSb), a giant magnetoresistance (GMR) element, for example, a spin valve, an anisotropic magnetoresistance element (AMR), a tunneling magnetoresistance (TMR) element, and a magnetic tunnel junction (MTJ). The magnetic field sensing element may be a single element or, alternatively, may include two or more magnetic field sensing elements arranged in various configurations, e.g., a half bridge or full (Wheatstone) bridge. Depending on the device type and other application requirements, the magnetic field sensing element may be a device made of a type IV semiconductor material such as Silicon (Si) or Germanium (Ge), or a type III-V semiconductor material like Gallium-Arsenide (GaAs) or an Indium compound, e.g., Indium-Antimonide (InSb).

Figure 2:
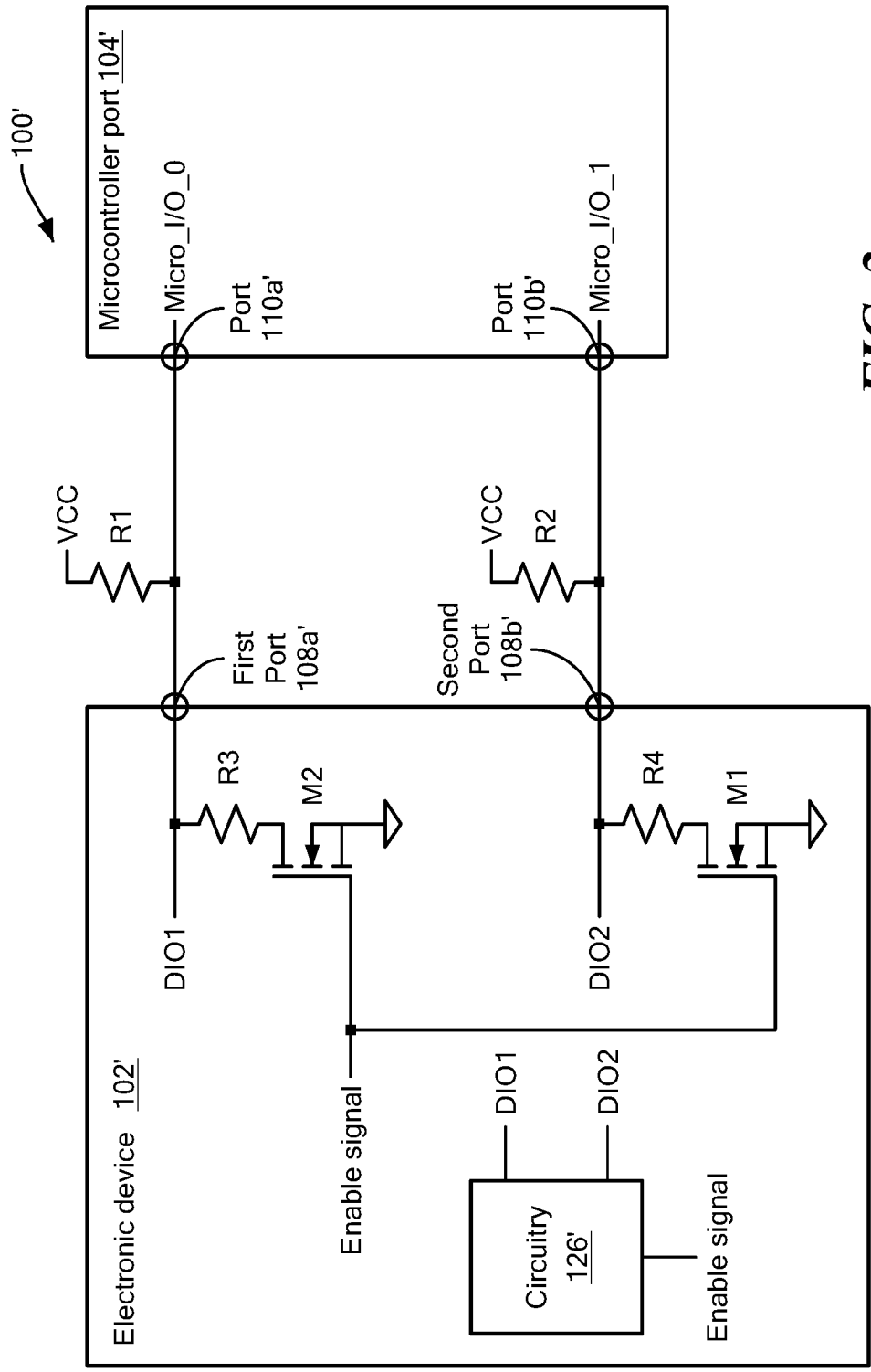
FIG. 2 is a circuit diagram of another example of the electronic circuitry of FIG. 1.

Referring to FIG. 2, a specific example of the electronic circuitry 100 is electronic circuitry 100'. The electronic circuitry 100' includes an electronic device 102' having ports (e.g., a port 108a' and a port 108b') and a microcontroller 104' having ports (e.g., a port 110a' and a port 110b').

The electronic circuitry 100' also includes resistors (e.g., a resistor R1 and a resistor R2) and each resistor R1, R2 is connected in series with the supply voltage VCC. Each resistor R1, R2 is also connected to a corresponding one of the ports 108a', 108b' of the electronic device 102' and is connected to a corresponding one of the ports 110a', 110b' of the microcontroller 104'. For example, the resistor R1 is connected to the port 108a' and to the port 110a', and the resistor R2 is connected to the port 108b' and to the port 110b'.

Each of the ports 108a', 108b' have a corresponding voltage signal (e.g., a voltage signal DIO1 and a voltage signal DIO2). For example, the port 108a' has a voltage signal DIO1 and the port 108b' has the voltage signal DIO2.

The electronic device 102' may include circuitry 126' which may be substantially the same as the circuitry 126 (FIG. 1). The electronic device 102' may also include resistors (a resistor R3 and a resistor R4) connected to a transistor (e.g., a transistor M2 and a transistor M1) and to the ports 108a', 108b'. For example, the resistor R3 is connected in series with the transistor M2 and to the port 108a', and the resistor R4 is connected in series with the transistor M1 and to the port 108b'. Each of the transistors M2, M1 is connected to ground.

Figure 3:
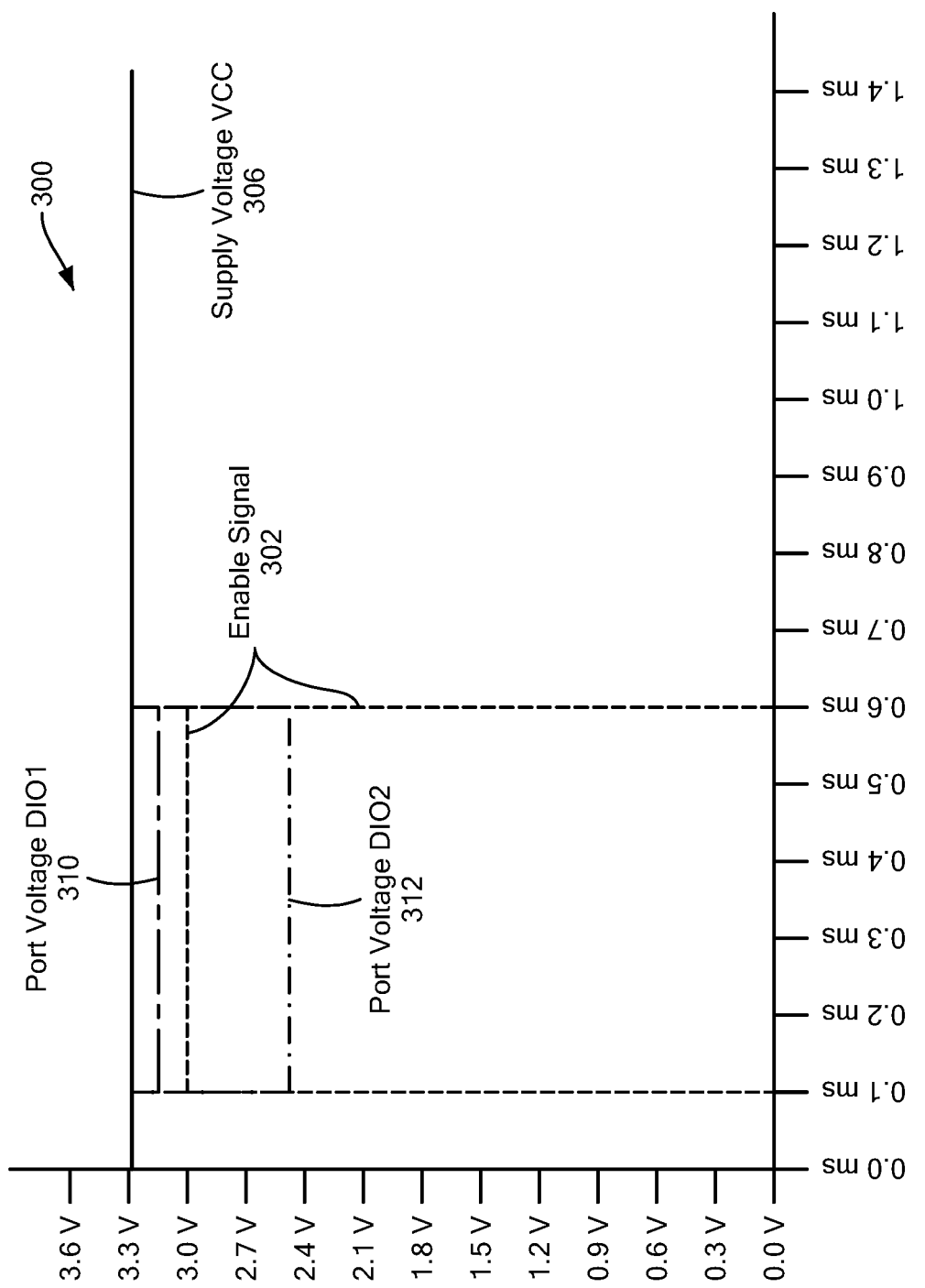
FIG. 3 is a graph of a specific example of a time-versus-voltage relationship for the electronic circuitry of FIG. 2.

Referring to FIG. 3, a specific example of time-versus-voltage relationship for the electronic circuitry of FIG. 2 is depicted in a graph 300. In this specific example, R1 is k ohms, R2 is 10 k ohms, R3 is 5 k ohms, R4 is 5 k ohms and a supply voltage VCC 306 is 3.3 volts. In this example, the transistor switches M2, M1 are closed when the enable signal 302 rises to 3.0 volts at 0.1 milliseconds in this example. When the transistor switches M2, M1 are closed, the signal voltage DIO1 310 is 83% of the supply voltage VCC and the voltage signal DIO2 312 is 33% of the supply voltage VCC. The transistor switches M2, M1 are open when the enable signal 302 drops to 0.0 volts after 0.5 milliseconds or at 0.6 milliseconds in this example. When the transistor switches M2, M1 are open, the signal voltages DIO1, DIO2 rise to the supply voltage VCC.

The processes and techniques described herein are not limited to the specific examples described. For example, the electronic device 102 may include a single port (e.g., the port 102a), a single resistance circuit (e.g., a resistance circuit 120a) and a single switching circuit (e.g., the switching circuit 122a).

Elements of different embodiments described herein may be combined to form other embodiments not specifically set forth above. Various elements, which are described in the context of a single embodiment, may also be provided separately or in any suitable subcombination. Other embodiments not specifically described herein are also within the scope of the following claims.

What is claimed is:

1. A magnetic field sensor, comprising:
a filter;
a switching circuit directly connected to a resistance circuit and connected to ground;
the resistance circuit directly connected to a port;
the port configured to be connected in series to an external resistor and a supply voltage; and
circuitry directly connected to the port and to the resistance circuit,
wherein the circuitry comprises a magnetic field sensing element comprising a Hall effect element or a magnetoresistance element,
wherein the circuitry provides a signal to open or close the switching circuit,
wherein a voltage at the port is a first voltage that is less than the supply voltage if the switching circuit is enabled to be a closed circuit,
wherein the voltage at the port is a second voltage that is equal to the supply voltage if the switching circuit is enabled to be an open circuit,
wherein the magnetic field sensor is configured to use the first voltage to set an address of the magnetic field sensor using a bus protocol at startup of the magnetic field sensor,
wherein the magnetic field sensor is further configured to use the first voltage to set a bandwidth of the filter after the startup of the magnetic field sensor, and
wherein the magnetic field sensor uses the magnetic field sensing element to sense a magnetic field after the startup of the magnetic field sensor.

2. The magnetic field sensor of claim 1, wherein the switching circuit is at least one transistor.

3. The magnetic field sensor of claim 2, wherein the at least one transistor is at least one n-channel metal oxide semiconductor field-effect transistor (MOSFET).

4. The magnetic field sensor of claim 1, wherein the resistance circuit comprises a resistor.

5. The magnetic field sensor of claim 1, wherein the switching circuit is enabled to be a closed circuit if the switching circuit receives an enable signal.

6. The magnetic field sensor of claim 5, wherein the switching circuit is enabled to be an open circuit if the switching circuit does not receive the enable signal.

7. The magnetic field sensor of claim 1, wherein the switching circuit is a first switching circuit, the resistance circuit is a first resistance circuit, the port is a first port and the external resistor is a first external resistor, and
further comprising:
a second switching circuit connected to a second resistance circuit and ground; and
the second resistance circuit connected to a second port; and
the second port configured to be connected in series to a second external resistor and the supply voltage,
wherein a voltage at the second port is a third voltage that is less than the supply voltage if the second switching circuit is enabled to be a closed circuit, the first and third voltages being used by the magnetic field sensor to determine an action; and
wherein the voltage at the second port is a fourth voltage that is equal to the supply voltage if the switching circuit is enabled to be an open circuit.

8. The magnetic field sensor of claim 7, wherein the first resistance circuit is equal in resistance to the second resistance circuit.

9. The magnetic field sensor of claim 1, wherein the switching circuit is directly connected to ground.

10. The magnetic field sensor of claim 1, wherein the bus protocol is an inter-integrated circuit (I2C) bus protocol.

11. The magnetic field sensor of claim 1, further comprising a fault comparator,
wherein the magnetic field sensor is further configured to use the first voltage to set a threshold for the fault comparator after the startup of the magnetic field sensor.

12. The magnetic field sensor of claim 11, further comprising a signal path,
wherein the magnetic field sensor is further configured to set a sensitivity of the signal path using first voltage after the startup of the magnetic field sensor.

13. Electronic circuitry, comprising:
a magnetic field sensor, comprising:
a magnetic field sensing element comprising a Hall effect element or a magnetoresistance element;
a filter;
a switching circuit directly connected to a resistance circuit and connected to ground;
the resistance circuit directly connected to a port;
the port; and
signal-providing circuitry directly connected to the port and to the resistance circuit;
a supply voltage; and
a resistor connected in series with the port and the supply voltage,
wherein the signal-providing circuitry provides a signal to open or close the switching circuit,
wherein a voltage at the port is a first voltage that is less than the supply voltage if the switching circuit is enabled to be a closed circuit,
wherein the voltage at the port is a second voltage that is equal to the supply voltage if the switching circuit is enabled to be an open circuit,
wherein the magnetic field sensor is configured to use the first voltage to set an address of the magnetic field sensor using a bus protocol at startup of the magnetic field sensor,
wherein the magnetic field sensor is further configured to use the first voltage to set a bandwidth of the filter after the startup of the magnetic field sensor, and
wherein the magnetic field sensor uses the magnetic field sensing element to sense a magnetic field after the startup of the magnetic field sensor.

14. The electronic circuitry of claim 13, further comprising a microcontroller connected to the port.

15. The electronic circuitry of claim 13, wherein the switching circuit is at least one transistor.

16. The electronic circuitry of claim 15, wherein the at least one transistor is at least one n-channel metal oxide semiconductor field-effect transistor (MOSFET).

17. The electronic circuitry of claim 13, wherein the resistance circuit comprises a resistor.

18. The electronic circuitry of claim 13, wherein the switching circuit is enabled to be a closed circuit if the switching circuit receives an enable signal.

19. The electronic circuitry of claim 18, the switching circuit is enabled to be an open circuit if the switching circuit does not receive the enable signal.

20. The electronic circuitry of claim 13, wherein the first voltage is used by the magnetic field sensor to determine an action.

21. The electronic circuitry of claim 14, wherein the switching circuit is a first switching circuit, the resistance circuit is a first resistance circuit, the port is a first port and the resistor is a first resistor,
wherein the magnetic field sensor, further comprises:
a second switching circuit coupled to a second resistance circuit and ground;
the second resistance circuit coupled to a second port; and
the second port connected to the microcontroller; and
further comprising a second resistor connected in series with the second port and the supply voltage,
wherein a voltage at the second port is a third voltage that is less than the supply voltage if the second switching circuit is enabled to be a closed circuit, the first and third voltages being used by the magnetic field sensor to determine an action,
wherein the voltage at the second port is a fourth voltage that is equal to the supply voltage if the switching circuit is enabled to be an open circuit, and
wherein the magnetic field sensor uses the magnetic field sensing element to sense a magnetic field after the startup of the magnetic field sensor.

22. The electronic circuitry of claim 21, wherein the first resistance circuit is equal in resistance to the second resistance circuit.

23. The electronic circuitry of claim 13, wherein the switching circuit is directly connected to ground.

24. The electronic circuitry of claim 13, wherein the bus protocol is an inter-integrated circuit (I2C) protocol.

25. The electronic circuitry of claim 13, wherein the magnetic field sensor further comprises a fault comparator,
wherein the magnetic field sensor is further configured to use the first voltage to set a threshold for the fault comparator after the startup of the magnetic field sensor.

26. The electronic circuitry of claim 25, wherein the magnetic field sensor further comprises a signal path,
wherein the magnetic field sensor is further configured to set a sensitivity of the signal path using first voltage after the startup of the magnetic field sensor.

27. A method comprising:
providing a first voltage at a port of ea magnetic field sensor comprising signal-providing circuitry and a switching circuit that is less than a supply voltage if the switching circuit is enabled to be a closed circuit, wherein the switching circuit is connected to ground and directly connected to a resistance circuit, and the resistance circuit is directly connected to the port, wherein the magnetic field sensor is a magnetic field sensor, wherein the signal-providing circuit comprises a magnetic field sensing element comprising a Hall effect element or a magnetoresistance element;
connecting the signal-providing circuitry directly to the port and to the resistance circuit;
providing a signal, from the signal-providing circuitry, to open or close the switching circuit;
setting an address of the magnetic field sensor in response to the first voltage using a bus protocol at startup of the magnetic field sensor;
setting a bandwidth of a filter of the magnetic field sensor in response to the first voltage after the startup of the magnetic field sensor; and providing a second voltage at the port of the magnetic field sensor that is equal to a supply voltage if the switching circuit is enabled to be an open circuit.

28. The method of claim 27, further comprising connecting a resistor to the port of the magnetic field sensor and to the supply voltage.

29. The method of claim 28, further comprising connecting a microcontroller to the port.

30. The method of claim 29, wherein the switching circuit is a first switching circuit, the resistance circuit is a first resistance circuit, the resistor is a first resistor, and the port is a first port, further comprising:
connecting a second resistor to a second port of the magnetic field sensor and to the supply voltage;
providing a third voltage at the second port of the magnetic field sensor that is less than a supply voltage if a second switching circuit is enabled to be a closed circuit, wherein the third voltage is associated with an action performed by the magnetic field sensor, wherein the second switching circuit is connected to ground and to a second resistance circuit and the second resistance circuit is connected to the second port; and
providing a fourth voltage at the second port of the magnetic field sensor that is equal to a supply voltage if the second switching circuit is enabled to be an open circuit.

31. The method of claim 30, further comprising connecting the microcontroller to the second port.

32. The method of claim 27, wherein the bus protocol is an inter-integrated circuit (I2C) bus protocol.

33. The method of claim 27, further comprising setting a threshold for a fault comparator after the startup of the magnetic field sensor in response to the first voltage.

34. The method of claim 33, further comprising setting a sensitivity of a signal path after the startup of the magnetic field sensor in response to the first voltage.

35. A magnetic field sensor, comprising:
a filter;
a first switching circuit directly connected to a first resistance circuit and connected to ground;
the first resistance circuit directly connected to a first port;
the first port configured to be connected in series to a first external resistor and a supply voltage;
a second switching circuit connected to a second resistance circuit and ground;
the second resistance circuit connected to a second port;
the second port configured to be connected in series to a second external resistor and the supply voltage; and
circuitry directly connected to the first port and to the first resistance circuit by a first connection and directly connected to the second port and to the second resistance circuit by a second connection, wherein the first and second switching circuits are connected to the circuitry to receive a signal from the circuitry to open or close the first and second switching circuits,
wherein in a first state:
a voltage at the first port is a first voltage that is less than the supply voltage, and the first switching circuit is enabled by the circuitry to be a closed circuit, and
a voltage at the second port is a third voltage that is less than the supply voltage, and the second switching circuit is enabled by the circuitry to be a closed circuit, and wherein in a second state, a period of time after the first state:
the voltage at the first port is a second voltage that is equal to the supply voltage, and the first switching circuit is enabled by the circuitry to be an open circuit, and
the voltage at the second port is a fourth voltage that is equal to the supply voltage, and the second switching circuit is enabled by the circuitry to be an open circuit,
wherein the circuitry comprises a magnetic field sensing element comprising a Hall effect element or a magnetoresistance element,
wherein the first and third voltages set an address of the magnetic field sensor at startup of the magnetic field sensor,
wherein the first and third voltages set a bandwidth of the filter after the startup of the magnetic field sensor, and
wherein the magnetic field sensor uses the magnetic field sensing element to sense a magnetic field after the startup of the magnetic field sensor.

36. The magnetic field sensor of claim 35, wherein an inter-integrated circuit (I2C) bus protocol is used to set the address of the magnetic field sensor at the startup of the magnetic field sensor.

37. The magnetic field sensor of claim 35, wherein the first switching circuit and/or the second switching circuit is at least one transistor.

38. The magnetic field sensor of claim 37, wherein the at least one transistor is at least one n-channel metal oxide semiconductor field-effect transistor (MOSFET).

39. The magnetic field sensor of claim 35, wherein the first resistance circuit and/or the second resistance circuit comprises a resistor.

40. The magnetic field sensor of claim 35, further comprising a fault comparator,
wherein the first and third voltages set a threshold of the fault comparator after the startup of the magnetic field sensor.

* * * * *

UNITED STATES PATENT AND TRADEMARK OFFICE
CERTIFICATE OF CORRECTION

PATENT NO. : 11,567,890 B2
APPLICATION NO. : 16/452804
DATED : January 31, 2023
INVENTOR(S) : Wade Bussing et al.

It is certified that error appears in the above-identified patent and that said Letters Patent is hereby corrected as shown below:

In the Specification

Column 1, Line 33 delete "port and the port." and replace with --port.--.

Column 3, Line 58 delete "to force" and replace with --forces--.

Column 3, Line 66 delete "100'" and replace with --126--.

Column 5, Lines 48-49 delete "milliseconds in this example." and replace with --milliseconds.--.

Column 7, Line 65 delete ", the switching" and replace with --, wherein the switching--.

Column 8, Line 47 delete "ea" and replace with --a--.

Signed and Sealed this
Twenty-sixth Day of December, 2023

Katherine Kelly Vidal
*Director of the United States Patent and Trademark Office*